(12) United States Patent
Jin et al.

(10) Patent No.: US 10,707,261 B2
(45) Date of Patent: Jul. 7, 2020

(54) SEMICONDUCTOR DEVICES INCLUDING INFRARED SENSOR WITH INFRARED PHOTODIODE AND COLOR SENSOR WITH COLOR PHOTODIODE

(71) Applicant: Samsung Electronics Co., Ltd., Suwon-si, Gyeonggi-do (KR)

(72) Inventors: Young Gu Jin, Suwon-si (KR); Doo Won Kwon, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/284,319

(22) Filed: Feb. 25, 2019

(65) Prior Publication Data

US 2019/0189671 A1 Jun. 20, 2019

Related U.S. Application Data

(63) Continuation of application No. 15/450,451, filed on Mar. 6, 2017, now Pat. No. 10,283,554.

(30) Foreign Application Priority Data

Sep. 2, 2016 (KR) .................. 10-2016-0113000

(51) Int. Cl.
*H01L 27/146* (2006.01)
*H04N 5/33* (2006.01)
*H04N 9/04* (2006.01)

(52) U.S. Cl.
CPC .... *H01L 27/14647* (2013.01); *H01L 27/1465* (2013.01); *H01L 27/14621* (2013.01);
(Continued)

(58) Field of Classification Search
CPC ......... H01L 27/14647; H01L 27/14652; H01L 27/14621; H01L 27/14627;
(Continued)

(56) References Cited

U.S. PATENT DOCUMENTS

| 8,436,308 B2 | 5/2013 | Choe et al. |
| 8,710,418 B2 | 4/2014 | Natori |

(Continued)

FOREIGN PATENT DOCUMENTS

| JP | 2015146364 A | 8/2015 |
| JP | 2015195235 A | 11/2015 |

(Continued)

OTHER PUBLICATIONS

U.S. Office Action dated Aug. 19, 2019 issued in corresponding U.S. Appl. No. 16/284,361.

(Continued)

*Primary Examiner* — Steven H Loke
*Assistant Examiner* — Juanita B Rhodes
(74) *Attorney, Agent, or Firm* — Harness, Dickey & Pierce, P.L.C.

(57) ABSTRACT

A semiconductor device may include a first sensor configured to sense light having a wavelength within a first wavelength range from incident light and generates a first electrical signal based on the sensed light and a second sensor configured to sense light having a wavelength within a second, different wavelength range from the incident light and generates a second electrical signal based on the sensed light. The first and second sensors may be electrically connected to each other via an intermediate connector, and the first sensor and the second sensor may share a pixel circuit that is electrically connected thereto via the intermediate connector. The first and second wavelength ranges may include infra-red and visible wavelength ranges, respectively. The first and second wavelength ranges may include different visible wavelength ranges.

19 Claims, 15 Drawing Sheets

(52) U.S. Cl.
CPC .. *H01L 27/14627* (2013.01); *H01L 27/14636* (2013.01); *H01L 27/14645* (2013.01); *H01L 27/14652* (2013.01); *H04N 5/332* (2013.01); *H04N 9/04* (2013.01)

(58) Field of Classification Search
CPC ......... H01L 27/14636; H01L 27/14645; H01L 27/1465; H04N 9/04; H04N 5/332
See application file for complete search history.

(56) References Cited

U.S. PATENT DOCUMENTS

| | | |
|---|---|---|
| 9,257,477 B2 | 2/2016 | Godaiin |
| 2009/0278048 A1* | 11/2009 | Choe ................. H01L 27/14647 250/339.05 |
| 2010/0020209 A1* | 1/2010 | Kim ................... H04N 5/37457 348/294 |
| 2010/0026865 A1* | 2/2010 | Tivarus ............. H01L 27/14647 348/308 |
| 2010/0276736 A1 | 11/2010 | Bocko et al. |
| 2014/0035083 A1 | 2/2014 | Wan et al. |
| 2014/0191357 A1 | 7/2014 | Lee |
| 2014/0327061 A1* | 11/2014 | Lee ................... H01L 27/14634 257/292 |
| 2015/0079718 A1 | 3/2015 | Chen et al. |
| 2015/0171146 A1 | 6/2015 | Ooki et al. |
| 2015/0287766 A1* | 10/2015 | Kim ...................... H01L 27/307 250/208.1 |
| 2016/0111457 A1 | 4/2016 | Sekine |
| 2016/0337605 A1 | 11/2016 | Ito |
| 2017/0117310 A1* | 4/2017 | Tatani ............... H01L 27/14621 |
| 2017/0237911 A1* | 8/2017 | Won .................. H01L 27/14623 348/164 |
| 2017/0278826 A1 | 9/2017 | Sugizaki et al. |
| 2017/0287976 A1 | 10/2017 | Yanagita et al. |
| 2017/0374306 A1 | 12/2017 | Vaartstra et al. |
| 2018/0006076 A1* | 1/2018 | Goto ................. H01L 27/14649 |
| 2018/0084164 A1 | 3/2018 | Hynecek et al. |

FOREIGN PATENT DOCUMENTS

| | | | | |
|---|---|---|---|---|
| KR | 20110134139 A | * | 12/2011 | ......... H01L 27/1469 |
| KR | 101530696 B1 | | 6/2015 | |
| WO | WO-2015115147 A1 | | 8/2015 | |
| WO | WO-2015151790 A1 | | 10/2015 | |

OTHER PUBLICATIONS

U.S. Office Action dated Feb. 20, 2020 for corresponding U.S. Appl. No. 16/284,381.

* cited by examiner

SEMICONDUCTOR DEVICES INCLUDING INFRARED SENSOR WITH INFRARED PHOTODIODE AND COLOR SENSOR WITH COLOR PHOTODIODE

CROSS-REFERENCE TO RELATED APPLICATIONS

This application is a continuation of U.S. application Ser. No. 15/450,451, filed on Mar. 6, 2017, which claims priority under 35 U.S.C. § 119 from Korean Patent Application No. 10-2016-0113000 filed on Sep. 2, 2016 in the Korean Intellectual Property Office, the disclosure of each of which is incorporated herein by reference in its entirety.

BACKGROUND OF THE DISCLOSURE

1. Field of the Disclosure

The present disclosure relates to semiconductor devices configured to be included in image sensors.

2. Description of the Related Art

Image sensors used in digital cameras, digital video cameras, smartphones, portable computers and the like may include a complementary metal oxide semiconductor (CMOS) image sensor, a charge coupled device (CCD) image sensor, or the like. An image sensor (e.g., a pixel) may include a sensing circuit. The sensing circuit may include a pixel array and its peripheral circuit, a logic circuit configured to drive the image sensor, a memory circuit configured to store image sensing data and the like.

In some cases, for example where a sensing circuit is configured to simultaneously sense an image of a color band and an image of infra-red (IR) band, an image sensor may include a space in which a pixel circuit configured to process the sensed electrical signal is located and an additional space in which the IR sensing circuit is located.

SUMMARY OF THE DISCLOSURE

Some example embodiments include a semiconductor device configured to include an image sensor configured to simultaneously sense an image of the color band and an image of the infra-red (IR) band, where the image sensor has a reduced size and/or reduced area.

However, example embodiments of the present disclosure are not restricted to the example embodiments expressly described herein. The above and other example embodiments that have not been mentioned will become more apparent to one of ordinary skill in the art to which the present disclosure pertains by referencing the detailed description of the present disclosure given below.

According to some example embodiments, a semiconductor device may include a lens configured to focus incident light, a first sensor, a second sensor, an intermediate connector, and a pixel circuit. The first sensor may include an IR photodiode configured to sense an infra-red portion of the focused incident light, the infra-red portion of the focused incident light having a wavelength within an infra-red wavelength range, the IR photodiode further configured to convert the sensed infra-red portion of the focused incident light into a first electrical signal. The first sensor may further include a first node configured to receive the first electrical signal from the IR photodiode. The second sensor may include a color photodiode configured to sense a visible portion of the focused incident light, the visible portion of the focused incident light having a wavelength within a visible wavelength range, the color photodiode further configured to convert the sensed visible portion of the focused incident light into a second electrical signal. The second sensor may further include a second node configured to receive the second electrical signal from the color photodiode. The intermediate connector may electrically connect the first node and the second node to each other. The pixel circuit may be electrically connected to the first sensor and the second sensor via the intermediate connector.

According to some example embodiments, a semiconductor device may include a lens configured to focus incident light, a first sensor, a second sensor, a pixel circuit, and a metal junction. The first sensor may be configured to sense an infra-red portion of the focused incident light, the infra-red portion of the focused incident light having a wavelength within an infra-red wavelength range. The first sensor may be further configured to convert the sensed infra-red portion of the focused incident light into a first electrical signal. The second sensor may be configured to sense a visible portion of the focused incident light, the visible portion of the focused incident light having a wavelength within a visible wavelength range. The second sensor may be further configured to convert the sensed visible portion of the focused incident light into a second electrical signal. The pixel circuit may be electrically connected to the first sensor and the second sensor. The metal junction may electrically connect the first sensor, the second sensor, and the pixel circuit to one another.

According to some example embodiments, a semiconductor device may include a lens configured to focus incident light, a first sensor, a second sensor, a pixel circuit, and a metal junction. The first sensor may be configured to sense light that is a first portion of the focused incident light, the first portion of the focused incident light having a wavelength within a first visible wavelength range. The first sensor may be further configured to output the sensed first portion of the focused incident light as a first electric signal. The second sensor may be configured to sense light that is a second portion of the focused incident light, the second portion of the focused incident light having a wavelength within a second visible wavelength range, the second visible wavelength range being different from the first visible wavelength range. The second sensor may be further configured to convert the sensed second portion of the focused incident light into a second electrical signal. The pixel circuit may be electrically connected to the first sensor and the second sensor. The metal junction may electrically connect the first sensor, the second sensor, and the pixel circuit to one another.

According to some example embodiments, a semiconductor device may include a first sensor, a second sensor, and a pixel circuit. The first sensor may be configured to sense a first portion of incident light, the first portion of incident light having a wavelength within a first wavelength range. The first sensor may be further configured to generate a first electrical signal based on the sensed first portion of the incident light. The second sensor may be electrically connected to the first sensor via an intermediate connector, the second sensor configured to sense a second portion of incident light, the second portion of incident light having a wavelength within a second wavelength range, the second wavelength range being different from the first wavelength range. The second sensor may be further configured to generate a second electrical signal based on the sensed second portion of the incident light. The pixel circuit may be electrically connected to the first sensor and the second sensor via the intermediate connector.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE DISCLOSURE

Figure 1:
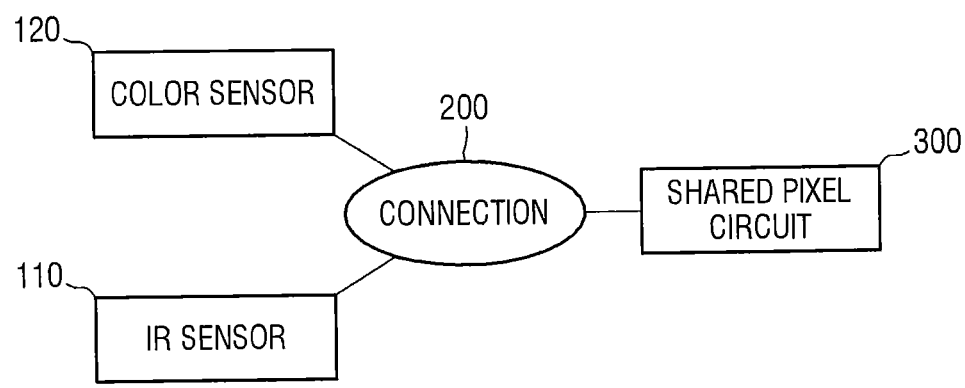
FIG. 1 is a block diagram illustrating a semiconductor device according to some example embodiments.

FIG. 1 is a block diagram illustrating a semiconductor device according to some example embodiments.

Referring to FIG. 1, a semiconductor device 1 according to some example embodiments may include an IR sensor 110, a color sensor 120, an intermediate connector 200 and a pixel circuit 300. In some example embodiments of the present disclosure, the semiconductor device 1 may be an image sensor.

The IR sensor 110 may be configured to sense light of the infra-red (IR) band from the incident light focused through a lens provided in the image sensor. Restated, the IR sensor 110 may be a sensor that is configured to sense a portion of the focused incident light, where the portion of the focused incident light is light having a wavelength within an infra-red wavelength range (also referred to herein as an infra-red band). The infra-red wavelength range may be between about 700 nm and 1 mm. The IR sensor 110 may be configured to sense light having a wavelength range that is a limited portion of the IR wavelength range, including near-infrared light, short-wavelength infrared light, mid-wavelength infrared light, long-wavelength infrared light, far-infrared light, some combination thereof, or the like. Focused incident light may be light that is incident on a lens of the image sensor (e.g., "ambient light"). In some example embodiments, the lens may include a micro lens.

The IR sensor 110 may include one or more IR photodiodes, and a floating diffusion (FD) node, and one or more IR photodiodes are configured to monitor (e.g., "sense") a portion of the incident light focused through the lens that has a wavelength within the IR wavelength range. The one or more IR photodiodes may be configured to convert the sensed light into an electrical signal. Such conversion of light into an electrical signal may also be referred to herein as generating an electrical signal based on sensing light. The electrical signal may be applied to the FD node, may be transmitted to a pixel circuit described later, and may be output as an instance of image sensing data.

The color sensor 120 may be configured to sense light of the color band from the incident light focused through the lens provided in the image sensor. Restated, the color sensor 120 may be a sensor that is configured to sense a portion of the focused incident light, where the portion of the focused incident light is light having a wavelength within a visible wavelength range (also referred to herein as a visible band). The visible wavelength range may be between about 400 nm and about 700 nm. The color sensor 120 may be configured to sense light having a wavelength range that is a limited portion of the visible wavelength range, including light having a particular "color." In some example embodiments, light of the color band (e.g., a wavelength range of the sensed portion of the incident light), for example, may include at least one of Red, Green, and Blue wavelength bands. Also, in some example embodiments, color band may also include black and white bands.

The color sensor 120 includes one or more color photodiodes and a floating diffusion (FD) node, the one or more color photodiodes are configured to monitor ("sense") the light of the color band from ("incident") light focused through the lens, and are configured to convert the light into an electric signal (e.g., generate an electrical signal based on the sensed light). The converted electrical signal is applied to the FD node, is transmitted to a pixel circuit described later and is output as an image sensing data.

To enable the color photodiode to convert color of desired band into the electrical signal, the semiconductor device 1 may further include a color filter between the color sensor 120 and the lens. In some example embodiments, the color filters may include color filters including one or more of Bayer, RGB, RWB and RGBW, but the scope of the present disclosure is not limited thereto.

The electric signal converted by the IR photodiode of the IR sensor 110, and the electric signal converted by the color photodiode of the color sensor 120, are transmitted to the pixel circuit 300 through the intermediate connector 200.

The pixel circuit 300 is configured to output an electric signal transmitted through the intermediate connector 200 as the image sensing data. In FIG. 1, although the pixel circuit 300 is illustrated as being included in the semiconductor device 1, the pixel circuit 300 may also disposed outside the semiconductor device 1 in accordance with some example embodiments.

In some example embodiments, a sensing circuit is configured to simultaneously sense the image of the color band (e.g., sense an image based on sensing a visible portion of incident light) and the image of the IR band (e.g., sense an image based on sensing an infra-red portion of incident light). The semiconductor device 1 may include space for the pixel circuit 300 to enable the semiconductor device 1 to process the sensed electrical signals and may further include space for the area of the IR sensing circuit.

In some example embodiments, the IR sensor 110 and the color sensor 120 may be formed based on being laminated perpendicularly or substantially perpendicularly (e.g., perpendicularly within manufacturing tolerances and/or material tolerances) to each other. For example, because the color sensor 120 and the IR sensor 110 may be formed as independent layers, it is possible to further ensure that the semiconductor device 1 includes space for the area of the IR sensor 110, i.e., the IR sensing circuit, as compared to a case of forming the IR sensor and the color sensor as a single layer. In some example embodiments, including the example embodiments shown in FIG. 1, the IR sensor 110 and the color sensor 120 "overlap" each other based on being included in separate layers of a layered structure, such that the IR sensor 110 and the color sensor 120 are both on a common "footprint" area of the semiconductor device 1. As a result, the total area of the semiconductor device 1 that is occupied by the IR sensor 110 and the color sensor 120 may be reduced, thereby reducing the size of the semiconductor device 1. A reduced size of a semiconductor device may refer to a reduced area of the semiconductor device in one or more planes. Thus, it is possible to improve the quality of the IR sensing.

In some example embodiments, the IR sensor 110 and the color sensor 120 share the pixel circuit 300 through the intermediate connector 200. Therefore, it is also possible to further reduce the size of the semiconductor device 1, and it is possible to sufficiently secure a space for embedding the pixel circuits 300 in the semiconductor device 1.

Hereinafter, some example embodiments will be described.

Figure 2:
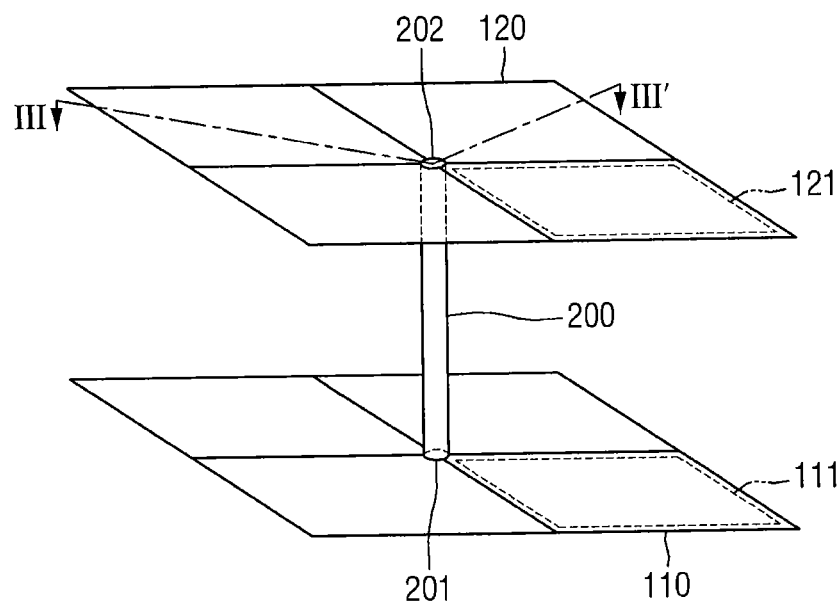
FIG. 2 is a conceptual diagram for explaining a semiconductor device according to some example embodiments.

FIG. 2 is a conceptual diagram for explaining a semiconductor device according to some example embodiments.

Referring to FIG. 2, the semiconductor device 2 according to some example embodiments includes an IR sensor 110, a color sensor 120 and an intermediate connector 200.

As described above, the IR sensor 110 includes a FD node 201 to which the electric signal converted from light of the IR band is applied via the IR photodiode.

As described above, the color sensor 120 includes a FD node 202 to which the electric signal converted from light of the color band via the color photodiode is applied.

The FD node 201 and the FD node 202 are electrically connected to each other via the intermediate connector 200.

FIG. 2 illustrates a configuration in which the color sensor 120 has four pixels 121, and the IR sensor 110 has four pixels 111. In some example embodiments, including the example embodiments shown in FIG. 2, the resolutions of the color sensor 120 and the IR sensor 110 are equal to each other. In some example embodiments, the resolutions of the color sensor 120 and the IR sensor 110 are not equal to each other.

In FIG. 2, each of the four pixels 121 of the color sensor 120 includes a single color photodiode. However, in the example embodiments shown in FIG. 2, each pixel 121 of the color sensor 120 corresponds to a single pixel of the color filter which will be described later. In other words, each pixel 121 of the color sensor 120 corresponds to a single lens to be described later. Such a color sensor 120 will be referred to as a 1PD type color sensor for the sake of convenience.

Similarly, each of the four pixels 111 of the IR sensor 110 of FIG. 2 includes a single IR photodiode. However, in the present embodiment, each pixel 111 of the IR sensor 110 corresponds to a single pixel of the color filter which will be described later. In other words, each pixel 111 of the IR sensor 110 corresponds to a single lens to be described later. Such an IR sensor 110 will be referred to as a 1PD type IR sensor for the sake of convenience.

Figure 3:
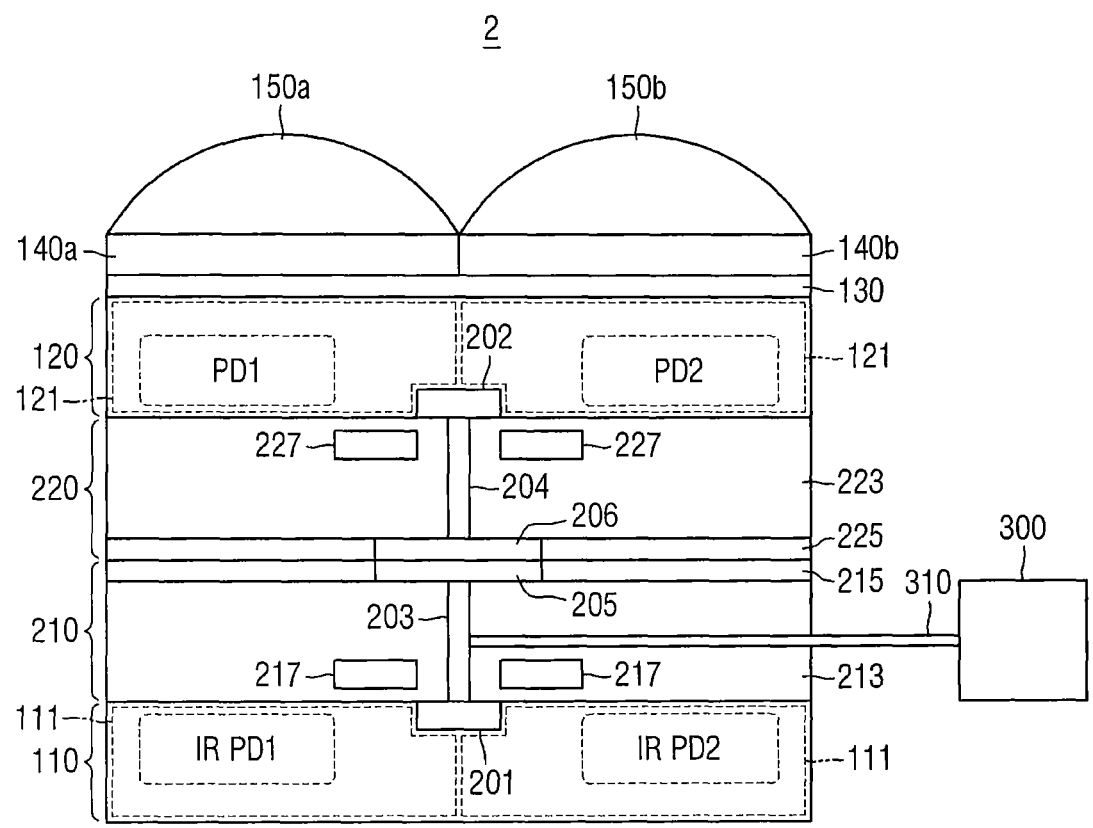
FIG. 3 is a diagram illustrating a cross-section taken from a line III-III' of the semiconductor device of FIG. 2.

FIG. 3 is a diagram illustrating a cross-section taken from a line III-III' of the semiconductor device of FIG. 2.

Referring to FIG. 3, the semiconductor device 2 of FIG. 2 includes an IR sensor 110, wiring layers 210 and 220, a color sensor 120, an insulating layer 130, color filters 140a and 140b and lenses 150a and 150b.

In this embodiment, the IR sensor 110 is an IR sensor that is provided as a 1PD type.

Specifically, the IR sensor 110 includes a first IR photodiode IR PD1 and a second IR photodiode IR PD2, the first IR photodiode IR PD1 corresponds to the color filter 140a, and the second IR photodiode IR PD2 corresponds to the color filter 140b. In other words, the first IR photodiode IR PD1 corresponds to the lens 150a, and the second IR photodiode IR PD2 corresponds to the lens 150b.

The first IR photodiode IR PD1 may be configured to sense at least a portion of the light filtered by the first color filter 140a and the second IR photodiode IR PD2 may be configured to sense at least a portion of the light filtered by the second color filter 140b. The first color filter 140a may be configured to filter light associated with a first visible wavelength range from a visible portion of the focused incident light. The second color filter 140b may be configured to filter light associated with a second visible wavelength range from the visible portion of the focused incident light.

Further, the IR sensor 110 includes a FD node 201 to which the electric signal converted from light of the IR band through the first and second IR photodiodes IR PD1 and IR PD2 is applied.

Meanwhile, the color sensor 120 is a color sensor that is provided as a 1PD type.

Specifically, the color sensor 120 includes a first color photo-diode PD1 and a second color photodiode PD2, the first color photodiode PD1 corresponds to the color filter 140a, and the second color photodiode PD2 corresponds to the color filter 140b. In other words, the first color photodiode PD1 corresponds to the lens 150a, and the second color photodiode PD2 corresponds to the lens 150b.

The first color photodiode PD1 may be configured to sense at least a portion of the light filtered by the first color filter 140a and the second color photodiode PD2 may be configured to sense at least a portion of the light filtered by the second color filter 140b. For example, if and/or when the first color filter 140a is configured to filter a first limited portion of the visible incident light, the first limited portion including light having a wavelength within a first visible wavelength range, the first color photodiode PD1 may be configured to sense light associated with the first visible wavelength range filtered by the first color filter 140a. In another example, if and/or when the second color filter 140b is configured to filter a second, different limited portion of the visible incident light, the second limited portion including light having a wavelength within a second, different visible wavelength range, the second color photodiode PD2 may be configured to sense light associated with the second visible wavelength range filtered by the second color filter 140b.

The color sensor 120 includes a FD node 202 to which an electric signal converted from the light of the color band through the first and second color photodiodes PD1 and PD2 is applied.

In some example embodiments, the first IR photodiode IR PD1 is disposed below the first color photodiode PD1, and the second IR photodiode IR PD2 may be disposed below the second color photodiode PD2. Such disposition may be referred to as "overlapping." For example, in the example embodiments shown in FIG. 3, the first IR photodiode IR PD1 may overlap the first color photodiode PD1 (e.g., overlap in relation to the lens 150a and/or the first color filter 140a) and the second IR photodiode IR PD2 may overlap the second color photodiode PD2 (e.g., overlap in relation to the lens 150b and/or the second color filter 140b). Such overlapping may be referred to as "vertically overlapping," "overlapping in a direction that is perpendicular or substantially perpendicular in relation to a plane through which at least one of the IR sensor 110 and the color sensor 120 may extend, some combination thereof, or the like. As referred to herein, "substantially perpendicular" will be understood to include "perpendicular within manufacturing tolerances and/or material tolerances."

When specifically describing the intermediate connector 200 of FIG. 2, the intermediate connector 200 includes conductive joints 203 and 204 and metal junctions 205 and 206. In some example embodiments, the metal junctions 205 and 206 may be formed by Cu—Cu bonding, but the scope of the present disclosure is not limited thereto.

Layers 215 and 225, each of layers 215 and 225 including an insulating material, are formed around the metal junctions 205 and 206, and a layer 223 including an insulating material is formed around the conductive joints 203 and 204. The layer 223 may include transmission gates 217 and 227 as needed.

The FD node 201 and the FD node 202 are electrically joined to each other (e.g., electrically connected to each other) through the conductive joint 203, the metal junction 205, the metal junction 206 and the conductive joint 204. Further, the conductive joint 310 is also formed between one of the conductive joint 203 and 204 and the pixel circuit 300.

Because the IR sensor 110 and the color sensor 120 are formed as independent layers which are vertically laminated (e.g., laminated in a direction perpendicular or substantially perpendicular to a plane through which at least one of the IR sensor 110 and the color sensor 120 extends), it is possible to further secure the area of the IR sensor 110, i.e., the IR sensing circuit, as compared to a case of forming the IR sensor and the color sensor as a single layer. Restated, in some example embodiments, including the example embodiments shown in FIG. 2 and FIG. 3, the IR sensor 110 and the color sensor 120 "overlap" each other based on being included in separate layers of a layered structure, such that the IR sensor 110 and the color sensor 120 are both on (e.g., both occupy) a common "footprint" area of a semiconductor device. As a result, the total area of the semiconductor device 2 that is occupied by the IR sensor 110 and the color sensor 120 may be reduced, thereby reducing the size of the semiconductor device 2. Thus, it is possible to improve the quality of the IR sensing functionality implemented by a semiconductor device 2. In addition, the IR sensor 110 and the color sensor 120 share the pixel circuit 300 through the intermediate connector 200 that includes the conductive joint 203, the metal junction 205, the metal junction 206 and the conductive joint 204. Therefore, it is also possible to reduce the size of the semiconductor device 2, and it is possible to sufficiently secure a space for embedding the pixel circuits 300 in the semiconductor device 2.

In some example embodiments, color sensor 120 is a second IR sensor, and the separate sensors 110 and 120 may be configured to sense separate portions of incident light focused by lenses 150a and 150b, where the separate portions of incident light have wavelengths within different wavelength ranges of an infra-red wavelength range. For example, in the example embodiments shown in FIG. 3, IR sensor 110 may be configured to sense light having a wavelength within a near-IR wavelength range, and sensor 120 may be configured to sense light having a wavelength within a far-IR wavelength range.

Figure 4:
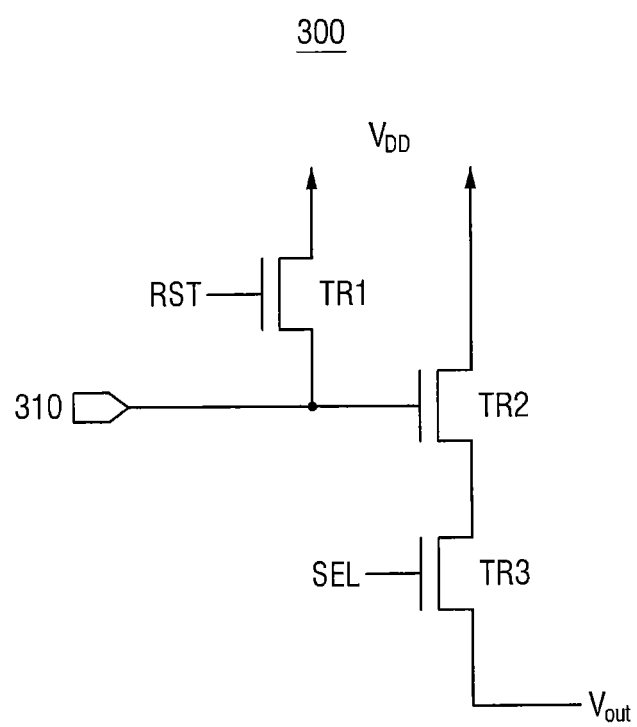
FIG. 4 is a circuit diagram for explaining an example of a pixel circuit.

FIG. 4 is a circuit diagram for explaining an example of the pixel circuit.

Referring to FIG. 4, the pixel circuit 300 includes a reset transistor TR1, a tracking transistor TR2 and a selection transistor TR3.

The transmission gates 217 and 227 described in FIG. 3 may be configured to select and transmit each output of the first and second IR photodiodes IR PD1 and IR PD2, and first and second color photodiodes PD1 and PD2, respectively, and the output may be transmitted to the pixel circuit 300 via the conductive joint 310 that is formed between one of the conductive joints 203 and 204 and the pixel circuit 300.

The tracking transistor TR2 may be configured to output (Vout) the photoelectrically converted electrical signal through the drain in accordance with an electrical signal applied to the gate via the conductive joint. The electrical signal applied to the gate of the tracking transistor TR2 may be an output transmitted from at least one of the transmission gates 217 and 227. The selection transistor TR3 is configured to turn on/off the output, and the reset transistor TR1 is intended to reset the pixel circuit 300.

However, it should be noted that the circuit configuration described in this example is only an example for providing the pixel circuit 300, and the scope of the present disclosure is not limited thereto.

Figure 5A:
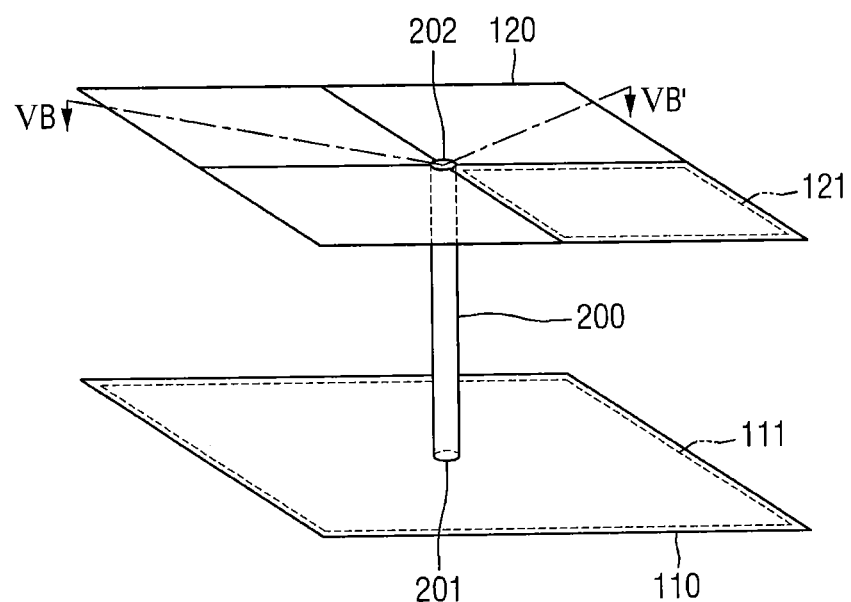
FIG. 5A is a conceptual diagram for explaining the semiconductor device according to some example embodiments.

FIG. 5A is a conceptual diagram for explaining a semiconductor device according to some example embodiments.

Referring to FIG. 5A, a semiconductor device 3 according to some example embodiments includes an IR sensor 110, a color sensor 120 and an intermediate connector 200.

The example embodiments illustrated in FIG. 5A may differ from the example embodiments illustrated in FIG. 2 in that the color sensor 120 of the present embodiments shown in FIG. 2 includes four pixels 121 and the IR sensor 110 of the present embodiments shown in FIG. 2 includes four pixels 111, but the color sensor 120 of the present embodiments shown in FIG. 5A includes four pixels 121 and the IR sensor 110 of the present embodiments shown in FIG. 5A includes a single pixel 111. That is, the example embodiments illustrated in FIG. 5A correspond to a case where the resolutions of the color sensor 120 and the IR sensor 110 are different from each other.

Figure 5B:
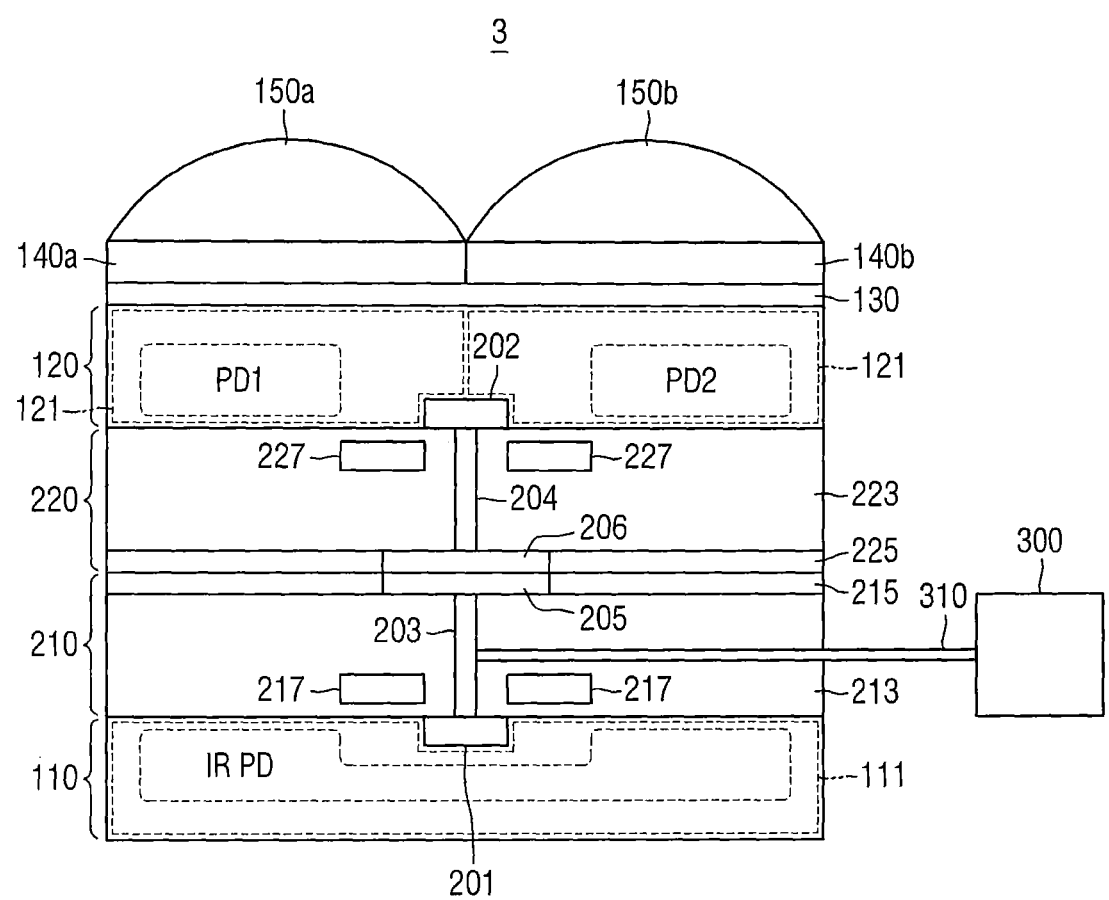
FIG. 5B is a diagram illustrating a cross-section taken from a line VB-VB' of the semiconductor device of FIG. 5A.

FIG. 5B is a diagram illustrating a cross-section taken from a line VB-VB' of the semiconductor device of FIG. 5A.

Referring to FIG. 5B, the semiconductor device 3 of FIG. 5A includes an IR sensor 110, wiring layers 210 and 220, a color sensor 120, an insulating layer 130, color filters 140a and 140b and lenses 150a and 150b.

In some example embodiments, including the example embodiments shown in FIG. 5B, the color sensor 120 is a color sensor that is provided as a 1PD type.

For example, the color sensor 120 may include a first color photodiode PD1 and a second color photodiode PD2, the first color photodiode PD1 corresponding to a color filter 140a, and the second color photodiode PD2 corresponding to a color filter 140b, such that the first color photodiode PD1 may be configured to sense at least a portion of the light filtered by the first color filter 140a and the second color photodiode PD2 may be configured to sense at least a portion of the light filtered by the second color filter 140b. In other words, the first color photodiode PD1 corresponds to the lens 150a, and the second color photodiode PD2 corresponds to the lens 150b.

In some example embodiments, including the example embodiments shown in FIG. 5B, the IR sensor 110 includes a single IR photodiode IR PD. The single IR photodiode IR PD may be disposed to extend in the horizontal direction below the first color photodiode PD1 and the second color photodiode PD2, such that the single IR photodiode may be configured to receive ("sense") IR light filtered through either of the color filters 140a and 140b. The single IR photodiode IR PD corresponds to both of the lens 150a and the lens 150b, such that the single IR photodiode may be configured to receive ("sense") IR light received and/or focused through either of the lens 150a and the lens 150b.

When specifically describing the intermediate connector 200 of FIG. 5A, as described in FIGS. 2 and 3, the intermediate connector 200 may include conductive joints 203 and 204 and metal junctions 205 and 206. Layers 215 and 225, each layer of layers 215 and 225 including an insulating material, are formed around the metal junctions 205 and 206, and a layer 223 including an insulating material is formed around the conductive joints 203 and 204. The layer 223 may include transmission gates 217 and 227 as needed.

The FD node 201 and the FD node 202 are electrically joined together through the conductive joint 203, the metal junction 205, the metal junction 206 and the conductive joint 204. Further, a conductive joint 310 is also formed between one of the conductive joints 203 and 204 and the pixel circuit 300.

Because the IR sensor 110 and the color sensor 120 are formed as independent layers which are vertically laminated (e.g., laminated in a direction perpendicular or substantially perpendicular to a plane through which at least one of the IR sensor 110 and the color sensor 120 extends), it is possible to further secure the area of the IR sensor 110, i.e., the IR sensing circuit, as compared to the case of forming the IR sensor and the color sensor as a single layer. Restated, in some example embodiments, including the example embodiments shown in FIG. 5A and FIG. 5B, the IR sensor 110 and the color sensor 120 "overlap" each other based on being included in separate layers of a layered structure, such that the IR sensor 110 and the color sensor 120 are both on (e.g., both occupy) a common "footprint" area of a semiconductor device. As a result, the total area of the semiconductor device 3 that is occupied by the IR sensor 110 and the color sensor 120 may be reduced, thereby reducing the size of the semiconductor device 3. Thus, it is possible to improve the quality of the IR sensing functionality implemented by a semiconductor device 3. In addition, the IR sensor 110 and the color sensor 120 share (e.g., are each electrically connected to) the pixel circuit 300 through the intermediate connector 200 that includes the conductive joint 203, the metal junction 205, the metal junction 206 and the conductive joint 204. Therefore, it is also possible to reduce the size of the semiconductor device 3, and it is possible to sufficiently secure a space for embedding the pixel circuits 300 in the semiconductor device 3.

Figure 6A:
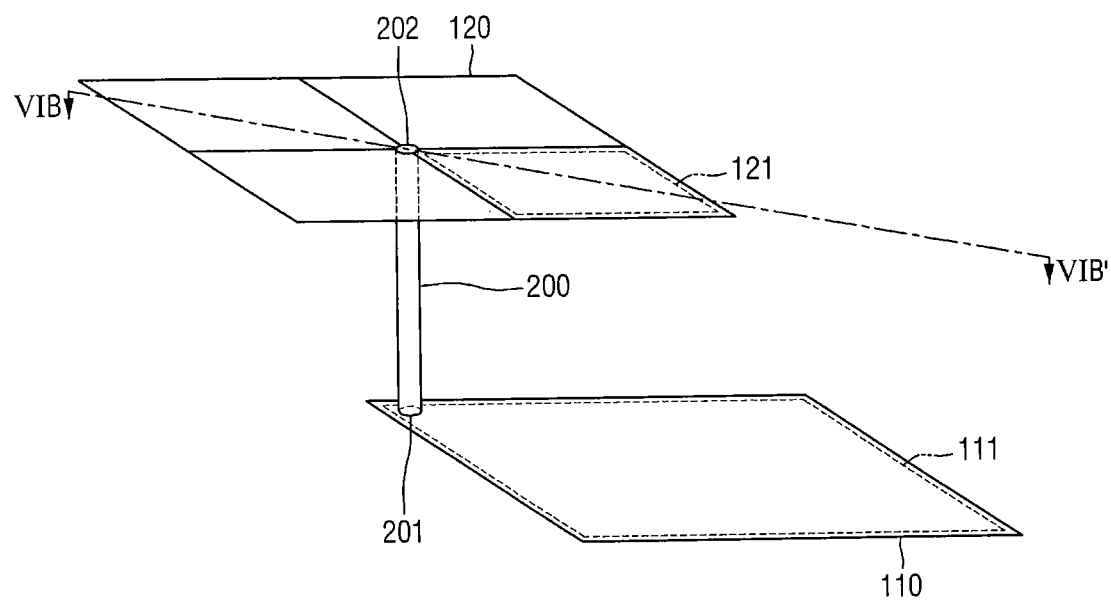
FIG. 6A is a conceptual diagram for explaining a semiconductor device according to some example embodiments.
Figure 6B:
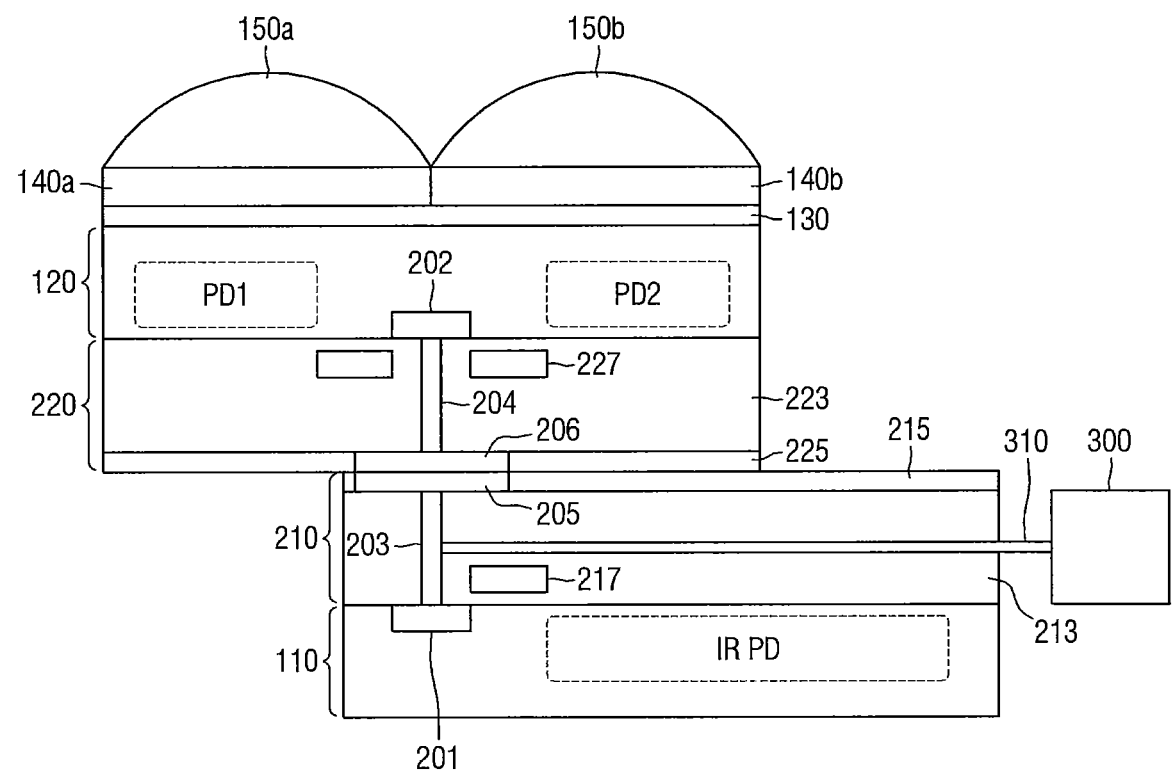
FIG. 6B is a diagram illustrating a cross-section taken from a line VIB-VIB' of the semiconductor device of FIG. 6A.

FIG. 6A is a conceptual diagram for explaining a semiconductor device according to some example embodiments, and FIG. 6B is a diagram illustrating a cross-section taken from a line VIB'-VIB' of the semiconductor device of FIG. 6A.

Referring to FIGS. 6A and 6B, similarly to FIG. 5A, a semiconductor device 3' according to some example embodiments includes an IR sensor 110, a color sensor 120 and an intermediate connector 200, and corresponds to the case where the resolutions of the color sensor 120 and the IR sensor 110 are different from each other.

The example embodiments illustrated in FIG. 6A may differ from the example embodiments illustrated in FIG. 5A in that the FD node 201 connected to the intermediate connector 200 of the present embodiments shown in FIG. 6A may be located in a corner area of the IR sensor 110 rather than being located in the intermediate region of the IR sensor 110 (e.g., a central region of the IR sensor), as illustrated in the example embodiments illustrated in FIG. 5A.

In the example embodiments illustrated in FIG. 6A, the IR sensor 110 includes a single IR photodiode IR PD. The single IR photodiode IR PD may be disposed to extend in the horizontal direction below the second color photodiode PD2. In some example embodiments, including the example embodiments shown in FIG. 6A, and as further shown in FIG. 6B, the single IR photodiode IR PD may correspond to a lens 150b and may be isolated from corresponding to the lens 150a, such that the single IR photodiode IR PD is configured to receive IR light focused by lens 150b and is configured to be isolated from receiving IR light focused by lens 150a. Because the IR sensor 110 and the color sensor 120 are formed as independent layers that are vertically laminated (e.g., laminated in a direction perpendicular or substantially perpendicular to a plane through which at least one of the IR sensor 110 and the color sensor 120 extends), it is possible to further ensure the area of the IR sensor 110, i.e., the IR sensing circuit as compared to the case of forming the IR sensor and the color sensor as a single layer. Restated, in some example embodiments, including the example embodiments shown in FIG. 6A and FIG. 6B, the IR sensor 110 and the color sensor 120 at least partially "overlap" each other based on being included in separate layers of a layered structure, such that the IR sensor 110 and the color sensor 120 both are at least partially on (e.g., both at least partially occupy) a common "footprint" area of a semiconductor device. As a result, the total area of the semiconductor device 3' that is occupied by the IR sensor 110 and the color sensor 120 may be reduced, thereby reducing the size of the semiconductor device 3'. Thus, it is possible to improve the quality of the IR sensing functionality implemented by a semiconductor device 3'. Furthermore, the IR sensor 110 and the color sensor 120 share the pixel circuit 300 through the intermediate connector 200 that includes the conductive joint 203, the metal junction 205, the metal junction 206 and the conductive joint 204. Therefore, it is also possible to reduce the size of the semiconductor device 3', and it is possible to sufficiently secure a space for embedding the pixel circuits 300 in the semiconductor device 3'.

Figure 7:
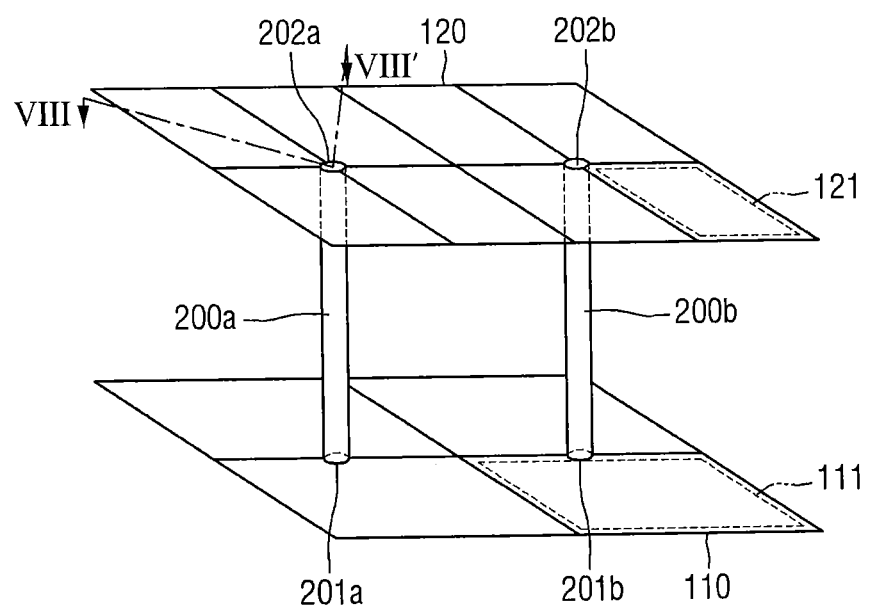
FIG. 7 is a conceptual diagram for explaining a semiconductor device according to some example embodiments.

FIG. 7 is a conceptual diagram for explaining a semiconductor device according to some example embodiments.

Referring to FIG. 7, a semiconductor device 4 according to some example embodiments includes an IR sensor 110, a color sensor 120 and intermediate connectors 200a and 200b.

As described above, the IR sensor 110 includes FD nodes 201a and 201b to which the electric signal converted from light of the IR band via the IR photodiode may be applied.

As described above, the color sensor 120 includes FD nodes 202a and 202b to which the electric signal converted from light of the color band via the color photodiode may be applied.

The FD nodes 201a and 201b and the FD nodes 202a and 202b are electrically connected to each other through the intermediate connectors 200a and 200b, respectively.

FIG. 7 illustrates a configuration in which the color sensor 120 has eight pixels 121 and the IR sensor 110 has four pixels 111. The example embodiments shown in FIG. 7 include a semiconductor device 4 that includes a color sensor 120 and an IR sensor 110, wherein the resolutions of the color sensor 120 and the IR sensor 110 are different from each other.

In some example embodiments, including the example embodiments shown in FIG. 7, each of the eight pixels 121 of the color sensor 120 includes a single color photodiode. In some example embodiments, each of two pixels 121 of the color sensor 120 correspond to a single pixel of a color filter to be described later. In other words, each of two pixels 121 of the color sensor 120, out of the eight pixels 121 of the color sensor 120 (e.g., a limited portion of the pixels of the color sensor 120) corresponds to a single lens to be described later. Such a color sensor 120 will be referred to as a 2PD type color sensor for the sake of convenience.

In some example embodiments, including the example embodiments shown in FIG. 7, the IR sensor 110 is relevant to a 1PD type IR sensor in which each pixel of the IR sensor 110 corresponds to a single lens to be described later.

Figure 8:
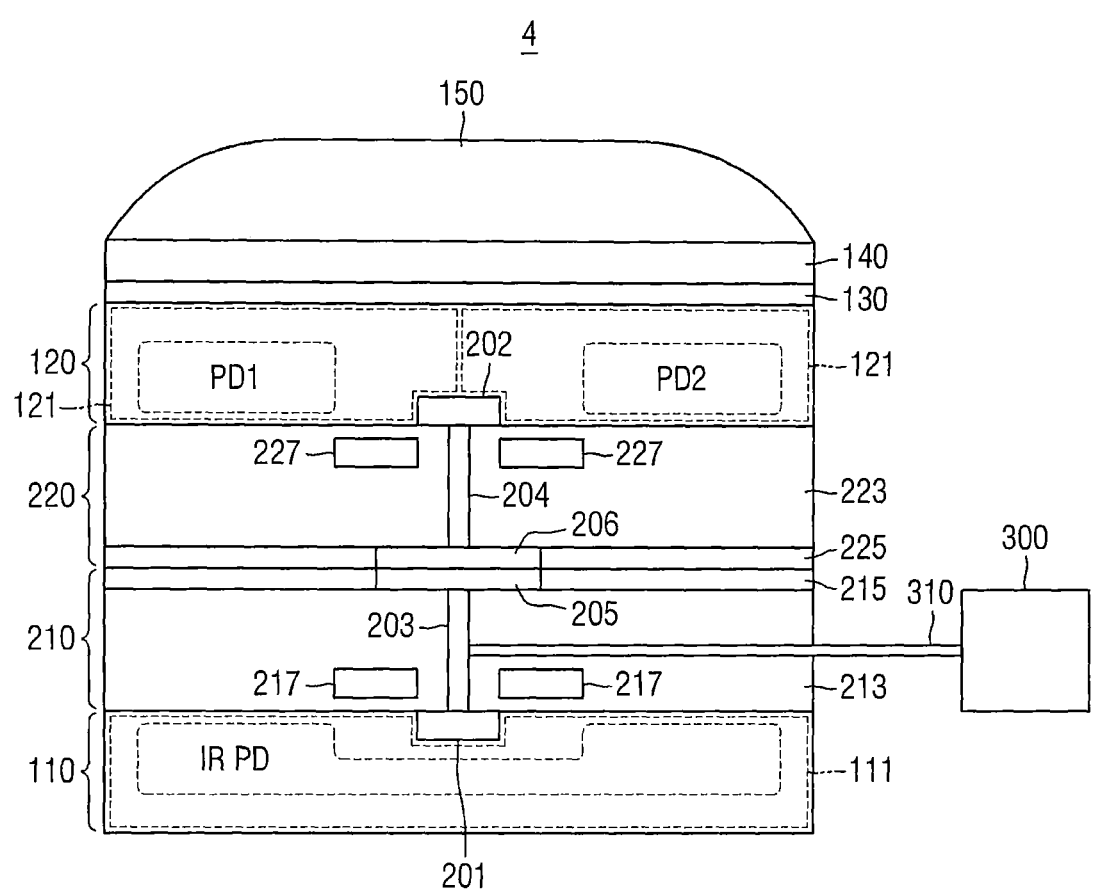
FIG. 8 is a diagram illustrating a cross-section taken from a line VIII-VIII' of the semiconductor device of FIG. 7.

FIG. 8 is a diagram illustrating a cross-section taken from a line VIII-VIII' of the semiconductor device of FIG. 7.

Referring to FIG. 8, a semiconductor device 4 of FIG. 7 includes an IR sensor 110, wiring layers 210 and 220, a color sensor 120, an insulating layer 130, a color filter 140 and a lens 150.

In the example embodiments shown in FIG. 8, the color sensor 120 is a color sensor that is provided as a 2PD type, where the color sensor 120 includes pixels 121.

Specifically, the color sensor 120 includes a first color photodiode PD1 and a second color photodiode PD2, the first and second color photodiodes PD1 and PD2 are included in separate pixels 121, and both of the first color photodiode PD1 and the second color photodiode PD2 correspond to the color filter 140, such that the first color photodiode PD1 and the second color photodiode PD2 may be configured to sense a portion of light filtered by the color filter 140. In some example embodiments, the first and second color photodiodes PD1 and PD2 may be configured to sense separate portions (e.g., wavelength ranges) of light filtered by the color sensor 140. As referred to herein, light "filtered by" a filter refers to light that passes through the filter. In other words, both of the first color photodiode PD1 and the second color photodiode PD2 corresponds to the lens 150.

In the example embodiments shown in FIG. 8, the IR sensor 110 includes a single IR photodiode IR PD. The single IR photodiode IR PD may be disposed to extend in the horizontal direction below the first color photodiode PD1 and the second color photodiodes IR PD2. Further, the single IR photodiode IR PD corresponds to the lens 150.

When specifically describing the intermediate connector 200 of FIG. 7, as described in FIGS. 2 and 3, the intermediate connector 200 includes conductive joints 203 and 204 and metal junctions 205 and 206. Layers 215 and 225, each layer of layers 215 and 225 including an insulating material, are formed around the metal junctions 205 and 206, and a layer 223 including an insulating material is formed around the conductive joints 203 and 204. The layer 223 may include transmission gates 217 and 227 as needed.

The FD node 201 and the FD node 202 are electrically connected to each other through the conductive joint 203, the metal junction 205, the metal junction 206 and the conductive joint 204. Further, a conductive joint 310 is also formed between one of the conductive joints 203 and 204 and the pixel circuit 300.

Because the IR sensor 110 and the color sensor 120 are formed as independent layers which are laminated vertically (e.g., laminated in a direction perpendicular or substantially perpendicular to a plane through which at least one of the IR sensor 110 and the color sensor 120 extends), it is possible to further secure the area of the IR sensor 110, i.e., the IR sensing circuit, as compared to the case of forming the IR sensor and the color sensor as a single layer. Restated, in some example embodiments, including the example embodiments shown in FIGS. 7-8, the IR sensor 110 and the color sensor 120 "overlap" each other based on being included in separate layers of a layered structure, such that the IR sensor 110 and the color sensor 120 are both on (e.g., both occupy) a common "footprint" area of a semiconductor device. As a result, the total area of the semiconductor device 4 that is occupied by the IR sensor 110 and the color sensor 120 may be reduced, thereby reducing the size of the semiconductor device 4. Thus, it is possible to improve the quality of the IR sensing functionality implemented by a semiconductor device 4. In addition, the IR sensor 110 and the color sensor 120 share the pixel circuit 300 through an intermediate connector 200 including the conductive joint 203, the metal junction 205, the metal junction 206 and the conductive joint 204. Therefore, it is also possible to reduce the size of the semiconductor device 4, and it is possible to sufficiently secure a space for embedding the pixel circuit 300 in the semiconductor device 4.

Figure 9:
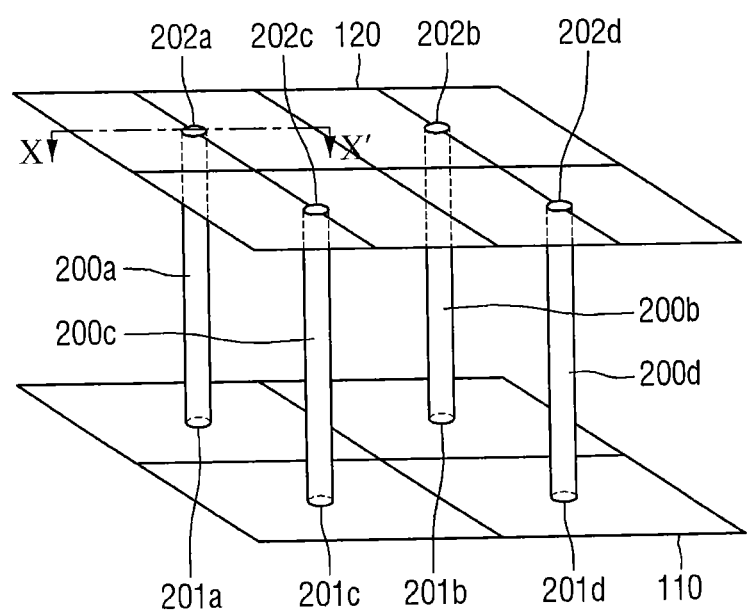
FIG. 9 is a conceptual diagram for explaining a semiconductor device according to some example embodiments.
Figure 10:
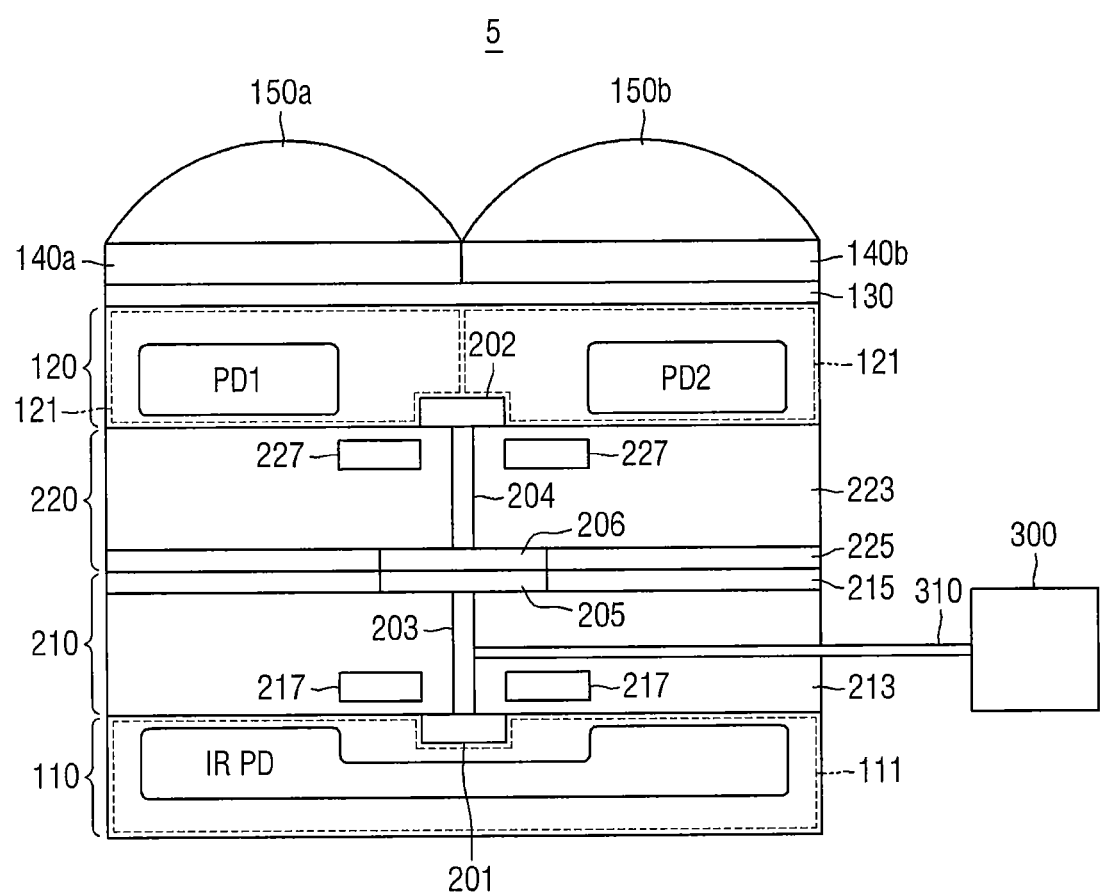
FIG. 10 is a diagram illustrating a cross-section taken from a line X-X' of the semiconductor device of FIG. 9.

FIG. 9 is a conceptual diagram for explaining a semiconductor device according to some example embodiments, and FIG. 10 is a diagram illustrating a cross-section taken from a line X-X' of the semiconductor device of FIG. 9.

In some example embodiments, including the example embodiments shown in FIGS. 9-10, the semiconductor device 5 includes an IR sensor 110, a color sensor 120 and intermediate connectors 200a to 200d, and the intermediate connectors 200a to 200d are formed at the center of intersection edge of the two pixels 121 of the color sensor 120, as compared to the example embodiments shown in at least FIGS. 7-8 where the intermediate connectors 200a to 200d are on the intersection of the four pixels 121 of the color sensor 120. Thus, in the cross-section of FIG. 10, the cross-sections of the first color photodiode PD1, the second color photodiode PD2 and the single IR photodiode IR PD are illustrated.

Figure 11:
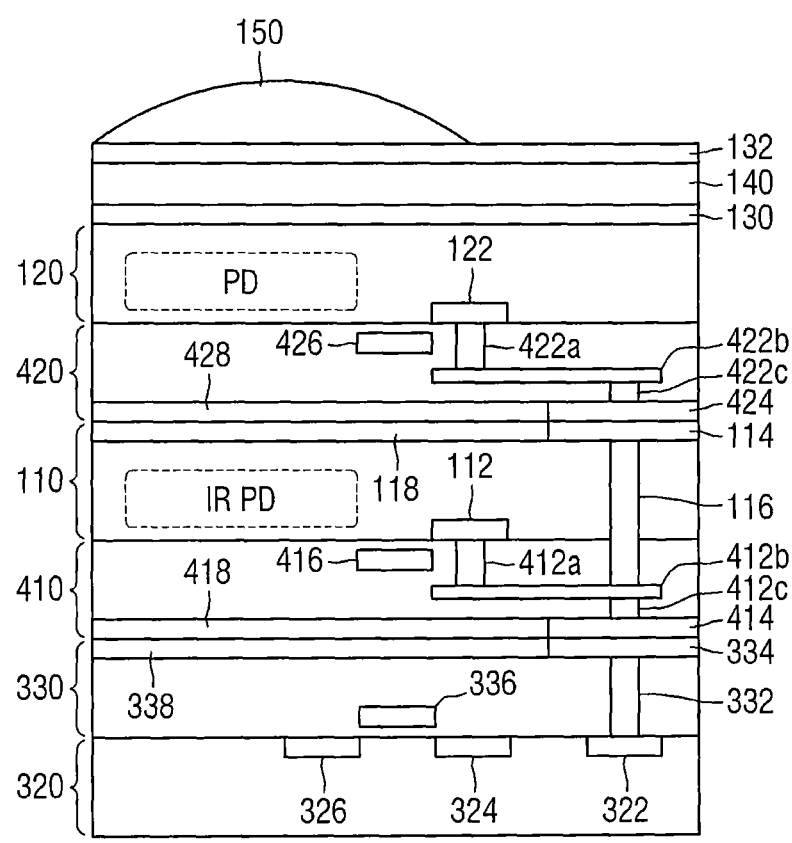
FIG. 11 is a diagram for explaining a semiconductor device according to some example embodiments.

FIG. 11 is a diagram for explaining a semiconductor device according to some example embodiments.

Referring to FIG. 11, the semiconductor device according to some example embodiments includes a lens 150, an IR sensor 110, a color sensor 120 and a pixel circuit 320.

That is, the example embodiments shown in FIG. 11 differs from the example embodiments shown in aforementioned drawings in that the pixel circuit 320 shared by the IR sensor 110 and the color sensor 120 is formed by being vertically laminated with the IR sensor 110 and the color sensor 120.

Particularly, it should be noted that the IR sensor 110, the color sensor 120 and the pixel circuit 320 are electrically connected to one another via at least one metal junction. In some example embodiments, the at least one metal junction may be formed by Cu—Cu bonding, but the scope of the present disclosure is not limited thereto.

In some example embodiments, the color sensor 120 and the IR sensor 110 are electrically connected to each other via the metal junctions 424 and 114. In some example embodiments, the metal junction 424 may be electrically connected to the FD node 122 via the conductive joints 422a to 422c. In some example embodiments, the metal junction 114 may be connected to the FD node 112 via the conductive joints 116, 412b and 412a.

In some example embodiments, the IR sensor 110 and the pixel circuit 320 are electrically connected to each other via the metal junctions 414 and 334. In some example embodiments, the metal junction 414 may be electrically connected to the FD node 112 via the conductive joints 412a to 412c. In some example embodiments, the metal junction 334 may be connected to the FD node 322 via the conductive joint 332.

Figure 12:
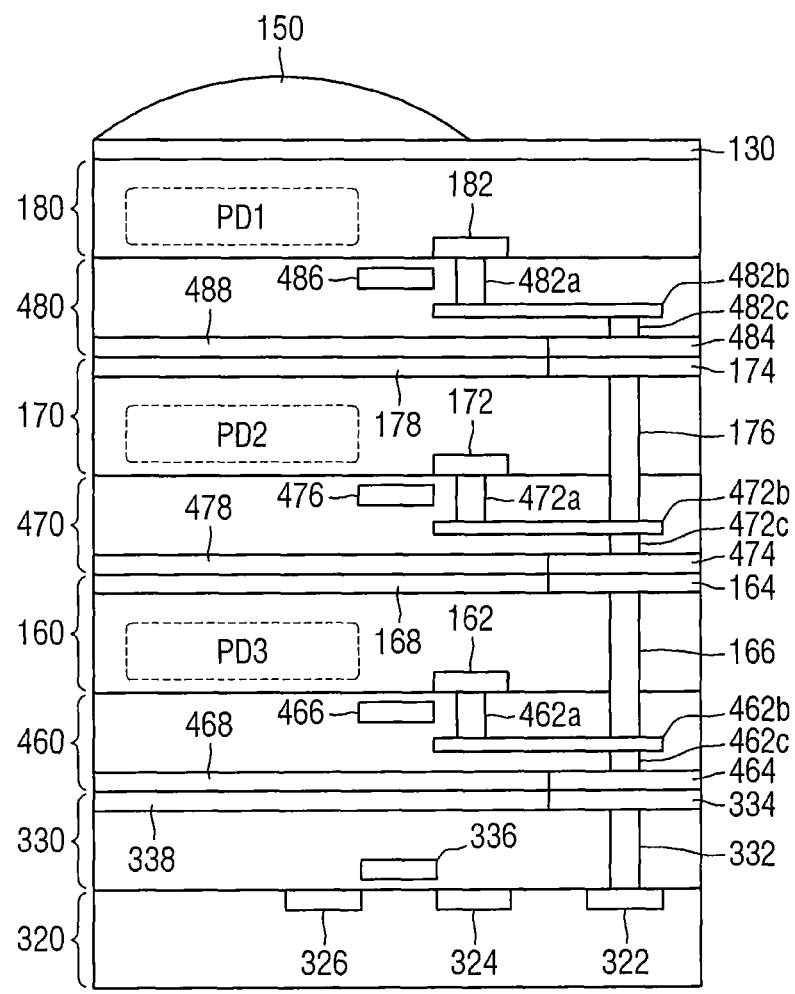
FIG. 12 is a diagram for explaining a semiconductor device according to some example embodiments.

FIG. 12 is a diagram for explaining a semiconductor device according to some example embodiments.

Referring to FIG. 12, the semiconductor device according to some example embodiments includes a lens 150, a first color sensor 160, a second color sensor 170, a third color sensor 180 and a pixel circuit 320.

Some example embodiments, including the example embodiments shown in FIG. 12, differ from the example embodiments shown in the aforementioned Figures in that the example embodiments shown in FIG. 12 includes a plurality of color sensors 160, 170, 180 formed by laminating the color sensors together. In some example embodiments, the number ("quantity") of the color sensors is illustrated as three, but the scope of the present disclosure is not limited thereto.

Particularly, it should be noted that the first color sensor 160, the second color sensor 170, the third color sensor 180 and the pixel circuit 320 are electrically connected to one another via at least one metal junction. In some example embodiments, the at least one metal junction may be formed by Cu—Cu bonding, but the scope of the present disclosure is not limited thereto.

For example, the third color sensor 180 and the second color sensor 170 are electrically connected to one another via the metal junctions 484 and 174. In some example embodiments, the metal junction 484 may be electrically connected to the FD node 182 via the conductive joints 482a to 482c. In some example embodiments, the metal junction 174 may be connected to the FD node 172 via the conductive joints 176, 472b and 472a.

In some example embodiments, the second color sensor 170 and the first color sensor 160 are electrically connected to each other via the metal junctions 474 and 164. At this time, the metal junction 474 may be electrically connected to the FD node 172 via the conductive joints 472a to 472c. Furthermore, the metal junction 164 may be connected to the FD node 162 via the conductive joints 166, 462b and 462a.

In some example embodiments, the first color sensor 160 and the pixel circuit 320 are electrically connected to each other via the metal junctions 464 and 334. In some example embodiments, the metal junction 464 may be electrically connected to the FD node 162 via the conductive joints 462a to 462c. In some example embodiments, the metal junction 334 may be connected to the FD node 322 via the conductive joint 332.

Figure 13:
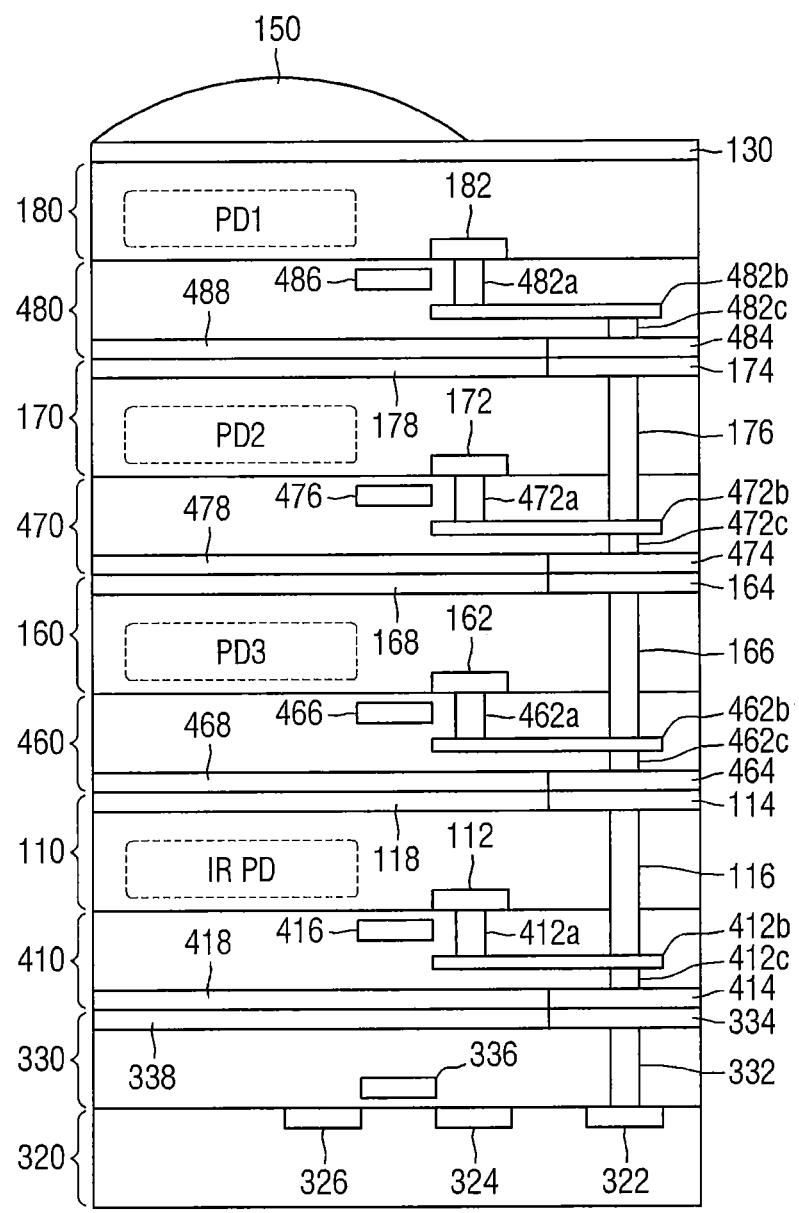
FIG. 13 is a diagram for explaining a semiconductor device according to some example embodiments.

FIG. 13 is a diagram for explaining a semiconductor device according to some example embodiments.

Referring to FIG. 13, the semiconductor device according to some example embodiments includes a lens 150, an IR sensor 110, a first color sensor 160, a second color sensor 170, a third color sensor 180 and a pixel circuit 320.

That is, some example embodiments differ from the aforementioned example embodiments in that the pixel circuit 320 shared by the IR sensor 110 and the first to third color sensors 160, 170 and 180 is formed by being vertically laminated with the IR sensor 110 and the first to third color sensors 160, 170 and 180.

Particularly, it should be noted that the IR sensor 110, the first color sensor 160, the second color sensor 170, the third color sensor 180 and the pixel circuit 320 are electrically connected to one another via the metal junctions. In some example embodiments, the metal junction may be formed by Cu—Cu bonding, but the scope of the present disclosure is not limited thereto.

For example, the third color sensor 180 and the second color sensor 170 are electrically connected to each other via the metal junctions 484 and 174. At this time, the metal junction 484 may be electrically connected to the FD node 182 via conductive joints 482a to 482c. Furthermore, the metal junction 174 may be connected to the FD node 172 via the conductive joints 176, 472b and 472a.

In some example embodiments, the second color sensor 170 and the first color sensor 160 are electrically connected to each other via the metal junctions 474 and 164. In some example embodiments, the metal junction 474 may be electrically connected to the FD node 172 via the conductive joints 472a to 472c. In some example embodiments, the metal junction 164 may be connected to the FD node 162 via the conductive joints 166, 462b and 462a.

In some example embodiments, the first color sensor 160 and the IR sensor 110 are electrically connected to each other via the metal junctions 464 and 114. In some example embodiments, the metal junction 464 may be electrically connected to the FD node 162 via the conductive joints 462a to 462c. In some example embodiments, the metal junction 114 may be connected to the FD node 112 via the conductive joints 116, 412b and 412a.

In some example embodiments, the IR sensor 110 and the pixel circuit 320 are electrically connected to each other via the metal junction 414 and 334. In some example embodiments, the metal junction 414 may be electrically connected to the FD node 112 via the conductive joints 412a to 412c. In some example embodiments, the metal junction 334 may be connected to the FD node 322 via the conductive joint 332.

Figure 14:
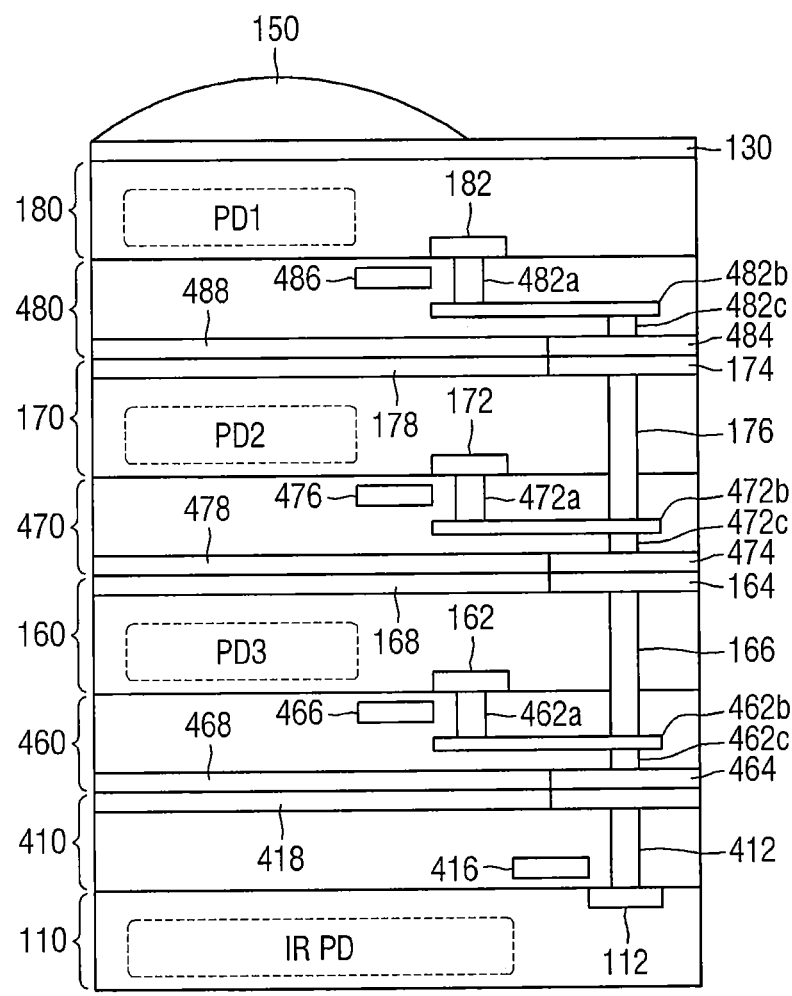
FIG. 14 is a diagram for explaining a semiconductor device according to some example embodiments.

FIG. 14 is a diagram for explaining a semiconductor device according to some example embodiments.

Referring to FIG. 14, the semiconductor device according to some example embodiments include a lens 150, an IR sensor 110, a first color sensor 160, a second color sensor 170 and a third color sensor 180, and a pixel circuit 320 is provided outside the semiconductor device.

Particularly, it should be noted that the IR sensor 110, the first color sensor 160, the second color sensor 170 and the third color sensor 180 are electrically connected to each other via the metal junction. In some example embodiments of the present disclosure, the metal junction may be formed by Cu—Cu bonding, but the scope of the present disclosure is not limited thereto.

For example, the third color sensor 180 and the second color sensor 170 are electrically connected to each other via metal junctions 484 and 174. In some example embodiments, the metal junction 484 may be electrically connected to the FD node 182 via the conductive joints 482a to 482c. In some example embodiments, the metal junction 174 may be connected to the FD node 172 via the conductive joints 176, 472b and 472a.

In some example embodiments, the second color sensor 170 and the first color sensor 160 are electrically connected to each other via metal junctions 474 and 164. In some example embodiments, the metal junction 474 may be electrically connected to the FD node 172 via the conductive joints 472a to 472c. In some example embodiments, the metal junction 164 may be connected to the FD node 162 via the conductive joints 166, 462b and 462a.

In some example embodiments, the first color sensor 160 and the IR sensor 110 are electrically connected to each other via the metal junctions 464 and 414. In some example embodiments, the metal junction 464 may be electrically connected to the FD node 162 via conductive joints 462a to 462c. In some example embodiments, the metal junctions 414 may be connected to the FD node 112 via the conductive joint 412.

In some example embodiments, including the example embodiments of FIGS. 11 to 14 described previously, the IR sensor and the color sensors may also be provided as a 1PD type and may also be provided as a 2PD type depending on the provision purposes.

Further, in some example embodiments, the semiconductor device may further include a logic circuit, a memory circuit and the like. The logic circuit (e.g., a processor) may include circuits configured to control the operation of the image sensor and/or control the communication with the outside, including a sensing circuit. The memory circuit (e.g., a memory) may include circuits configured store the image sensing data and/or programs of instruction that may be executed by the logic circuit to perform one or more elements of a semiconductor device of some of the example embodiments.

According to some example embodiments, a semiconductor device includes an IR sensor and color sensor, where the IR sensor and the color sensor are formed by being laminated perpendicularly to each other. That is, because the IR sensor and the color sensor are formed as independent layers, it is possible to further ensure the area of the IR sensing circuit as compared to the case of forming the IR sensor and the color sensor as a single layer. Thus, it is possible to improve the quality of the IR sensing functionality implemented by a semiconductor device.

In some example embodiments, the IR sensor and the color sensor share the pixel circuit through the intermediate connector. Therefore, it is also possible to reduce the size of the semiconductor device, and it is possible to sufficiently secure a space for embedding the pixel circuit in the semiconductor device.

In some example embodiments, at least one lens may be absent from the semiconductor device. For example, in the example embodiments shown in FIG. 3, lenses 150a and 150b may be absent from semiconductor device 1, such that incident light on the semiconductor device 1, and thus sensed by one or more sensors, photodiodes, etc. included therein, is not focused incident light that has been focused by one or more lenses.

While the present disclosure has been particularly illustrated and described with reference to example embodiments thereof, it will be understood by those of ordinary skill in the art that various changes in form and detail may be made therein without departing from the spirit and scope of the present disclosure as defined by the following claims. The example embodiments should be considered in a descriptive sense only and not for purposes of limitation.

What is claimed is:

1. An image sensor, comprising:
an infrared sensor including a first photodiode, a second photodiode, a third photodiode, and a first floating diffusion node;
a color sensor on the infrared sensor, the color sensor including a first color photodiode under a red color filter, a second color photodiode under a green color filter, a third color photodiode under a blue color filter, and a second floating diffusion node;
an intermediate connector connected to the first floating diffusion node and the second floating diffusion node; and
a pixel circuit connected to the infrared sensor and the color sensor via the intermediate connector,
wherein the first floating diffusion node is configured to receive electrical signals from each of the first photodiode, the second photodiode, and the third photodiode, and wherein the second floating diffusion node is configured to receive electrical signals from each of the first color photodiode, the second color photodiode, and the third color photodiode, such that the intermediate connector is an individual connector that is electrically coupled to each of the first, second, and third color photodiodes of the color sensor and the first, second, and third photodiodes of the infrared sensor and is configured to direct respective electrical signals from each of the first, second, and third color photodiodes of the color sensor and the first, second, and third photodiodes of the infrared sensor to the pixel circuit,
wherein the infrared sensor is configured to sense an infra-red portion of an incident light and the color sensor is configured to sense a visible portion of the incident light.

2. The image sensor of claim 1, wherein the color sensor further includes a fourth color photodiode under a separate green color filter and the second floating diffusion node is configured to receive electrical signals from the fourth color photodiode.

3. The image sensor of claim 1, wherein the intermediate connector includes a metal junction, the metal junction configured to electrically connect the first floating diffusion node and the second floating diffusion node.

4. The image sensor of claim 3, wherein the metal junction includes Cu—Cu bonding.

5. The image sensor of claim 1, wherein the pixel circuit is laminated with the infrared sensor and the color sensor.

6. The image sensor of claim 5, wherein the pixel circuit includes a third floating diffusion node, the third floating diffusion node configured to receive an electrical signal from the first floating diffusion node or an electrical signal from the second floating diffusion node via the intermediate connector.

7. An image sensor, comprising:
an infrared sensor including a first photodiode and a first floating diffusion node, the infrared sensor being configured to sense an infra-red portion of an incident light;
a color sensor on the infrared sensor, the color sensor including a first color photodiode, a second color photodiode, a third color photodiode, a fourth color photodiode, and a second floating diffusion node;
an intermediate connector connected to the first floating diffusion node and the second floating diffusion node; and
a pixel circuit connected to the infrared sensor and the color sensor via the intermediate connector, and
wherein the second floating diffusion node is configured to receive electrical signals from each of the first color photodiode, the second color photodiode, the third color photodiode, and the fourth color photodiode, such that the intermediate connector is an individual connector that is electrically coupled to each of the first, second, third, and fourth color photodiodes of the color sensor and the first photodiode of the infrared sensor and is configured to direct respective electrical signals from each of the first, second, third, and fourth color photodiodes of the color sensor and the first photodiode of the infrared sensor to the pixel circuit, wherein the color sensor is configured to sense a visible portion of the incident light.

8. The image sensor of claim 7, further comprising:
a bayer pattern of color filters, each color filter of the bayer pattern of color filters overlapping a separate, respective photodiode of the first color photodiode, the second color photodiode, the third color photodiode, and the fourth color photodiode.

9. The image sensor of claim 7, further comprising:
a red color filter overlapping the first color photodiode,
a green color filter overlapping the second color photodiode,
a blue color filter overlapping the third color photodiode, and
a white color filter overlapping the fourth color photodiode.

10. The image sensor of claim 8, wherein the color sensor has higher resolution than the infrared sensor.

11. The image sensor of claim 9, wherein the color sensor has higher resolution than the infrared sensor.

12. The image sensor of claim 8, wherein
the infrared sensor further includes a second photodiode, a third photodiode, and a fourth photodiode, and
the first floating diffusion node is configured to receive electrical signals from the first photodiode, the second photodiode, the third photodiode, and the fourth photodiode.

13. The image sensor of claim 9, wherein
the infrared sensor further includes a second photodiode, a third photodiode and a fourth photodiode, and
the first floating diffusion node is configured to receive electrical signals from each of the first photodiode, the second photodiode, the third photodiode, and the fourth photodiode, such that the intermediate connector is electrically coupled to each of the first, second, third, and fourth color photodiodes of the color sensor and the first, second, third, and fourth photodiodes of the infrared sensor and is configured to direct respective electrical signals from each of the first, second, third, and fourth color photodiodes of the color sensor and the first, second, third, and fourth photodiodes of the infrared sensor to the pixel circuit.

14. The image sensor of claim 12, wherein the color sensor has a same resolution as the infrared sensor.

15. The image sensor of claim 13, wherein the color sensor has a same resolution as the infrared sensor.

16. The image sensor of claim 7, wherein the intermediate connector includes a metal junction, the metal junction configured to electrically connect the first floating diffusion node and the second floating diffusion node.

17. The image sensor of claim 16, wherein the metal junction includes Cu—Cu bonding.

18. The image sensor of claim 7, wherein the pixel circuit is laminated with the infrared sensor and the color sensor.

19. The image sensor of claim 18, wherein the pixel circuit includes a third floating diffusion node, the third floating diffusion node configured to receive an electrical signal from the first floating diffusion node or an electrical signal from the second floating diffusion node via the intermediate connector.

* * * * *